United States Patent
Ravi

(10) Patent No.: US 6,987,028 B2
(45) Date of Patent: Jan. 17, 2006

(54) METHOD OF FABRICATING A MICROELECTRONIC DIE

(75) Inventor: Kramadhati V. Ravi, Atherton, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/627,509

(22) Filed: Jul. 24, 2003

(65) Prior Publication Data

US 2005/0019967 A1   Jan. 27, 2005

(51) Int. Cl.
*H01L 21/00* (2006.01)

(52) U.S. Cl. ............................ 438/26; 438/253; 438/626
(58) Field of Classification Search ................ 438/26, 438/153, 154, 157, 170, 204, 236, 253, 626
See application file for complete search history.

(56) References Cited

U.S. PATENT DOCUMENTS

| | | | |
|---|---|---|---|
| 5,272,104 A | 12/1993 | Schrantz et al. | |
| 5,650,639 A | 7/1997 | Schrantz et al. | |
| 5,696,665 A | 12/1997 | Nagy | |
| 5,853,888 A * | 12/1998 | Dutta et al. | 428/408 |
| 6,051,063 A | 4/2000 | Tanabe et al. | |
| 6,211,041 B1 | 4/2001 | Ogura | |
| 6,323,062 B1 * | 11/2001 | Gilleo et al. | 438/114 |
| 6,337,513 B1 | 1/2002 | Clevenger et al. | |
| 6,573,172 B1 * | 6/2003 | En et al. | 438/626 |
| 6,734,540 B2 * | 5/2004 | Fritz | 257/686 |

FOREIGN PATENT DOCUMENTS

| | | |
|---|---|---|
| EP | 0 814 509 A2 | 12/1997 |
| WO | PCT/US92/11068 | 7/1994 |

OTHER PUBLICATIONS

Liu, Huimin and Dandy, David S. *Diamond Chemical Vapor Deposition: Nucleation and Early Growth Stages*, 1995, pp. 1–7. Noyes Publications, Park Ridge, New Jersey, U.S.A.
Wolf, Stanley, Ph.D. and Tauber, Richard N., Ph.D. *Silicon Processing for the VLSI Era—vol. 1; Process Technology*, pp. 1–8. Lattice Press, Sunset Beach, California, U.S.A.

* cited by examiner

*Primary Examiner*—Phuc T. Dang
(74) *Attorney, Agent, or Firm*—Blakely, Sokoloff, Taylor & Zafman LLP

(57) ABSTRACT

A method of fabricating a microelectronic die is provided. Transistors are formed in and on a semiconductor substrate. A channel of each transistor is stressed after the transistors are manufactured by first forming a diamond intermediate substrate at an elevated temperature on a handle substrate, allowing the intermediate substrate and the handle substrate to cool, and then removing the handle substrate. The intermediate substrate has a lower coefficient of thermal expansion than the handle substrate, so that the intermediate substrate tends to bow when the handle substrate is removed. Such bowing creates a tensile stress, which translates into a biaxial strain in channels of the transistors. Excessive bowing is counteracted with a compensating polysilicon layer formed at an elevated temperature and having a higher CTE on a side of the diamond intermediate substrate.

14 Claims, 6 Drawing Sheets

METHOD OF FABRICATING A MICROELECTRONIC DIE

BACKGROUND OF THE INVENTION

1. Field of the Invention

This invention relates generally to a method of fabricating a microelectronic die, and more specifically to a method for increasing electron mobility values of channel regions of semiconductor transistors.

2. Discussion of Related Art

Transistors that make up integrated circuits of microelectronic dies are manufactured in and on silicon or other semiconductor substrates. Such a transistor has a channel region and source and drain regions on opposing sides of the channel region. The transistor further has a gate dielectric layer and a gate electrode which are formed on the channel region. A voltage that switches on the gate electrode can switch a current that flows between the source and drain regions through the channel region.

It has been recognized that a large tensile stress can increase both electron mobility of N-MOS devices and hole mobility of P-MOS devices. Several approaches to inducing strain in silicon have been proposed, including mechanical deformation of silicon wafers, local stressing of devices with thermal-expansion mismatched films, and the use of graded layer epitaxy of silicon germanium (SiGe) films on silicon followed by silicon epitaxy on the relaxed SiGe. The degree of stress that can be provided by these processes is usually relatively limited, which, when making a C-MOS wafer, necessitates that a tensile stress be provided for an N-MOS device and a compressive stress for a P-MOS device.

BRIEF DESCRIPTION OF THE DRAWINGS

The invention is described by way of example with reference to the accompanying drawings, wherein.

DETAILED DESCRIPTION OF THE INVENTION

A method of fabricating a microelectronic die is provided. Transistors are formed in and on a semiconductor layer. A channel of each transistor is stressed after the transistors are manufactured by first forming a diamond intermediate substrate at an elevated temperature on a handle substrate, allowing the intermediate substrate and the handle substrate to cool, attaching the semiconductor layer, and then removing the handle substrate. The intermediate substrate has a lower CTE than the handle substrate, so that the intermediate substrate tends to bow when the handle substrate is removed. Such bowing creates a tensile stress, which translates into a biaxial strain in channel regions of the transistors. Excessive bowing is counteracted with a compensating polysilicon layer formed at an elevated temperature and having a higher CTE on a side of the diamond intermediate substrate.

Figure 1:
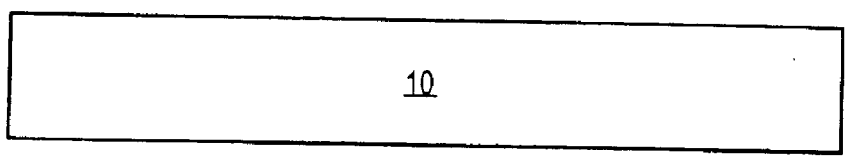
FIG. 1 is a side view representing a high-quality silicon handle substrate.

As illustrated in FIG. 1, the method of fabricating a microelectronic die, according to an embodiment of the invention, is initiated with a handle substrate 10. The handle substrate 10 is preferably a silicon substrate. One reason why a silicon substrate is preferred is because existing techniques allow for silicon substrates to be manufactured to a high degree of flatness. A further reason why silicon is preferred is because of the ability to deposit polysilicon thereon. Silicon is also a preferred substrate to be used in wafer manufacturing equipment, because such equipment is usually adjusted for the known responses of silicon to various thermal and chemical conditions.

Figure 2:
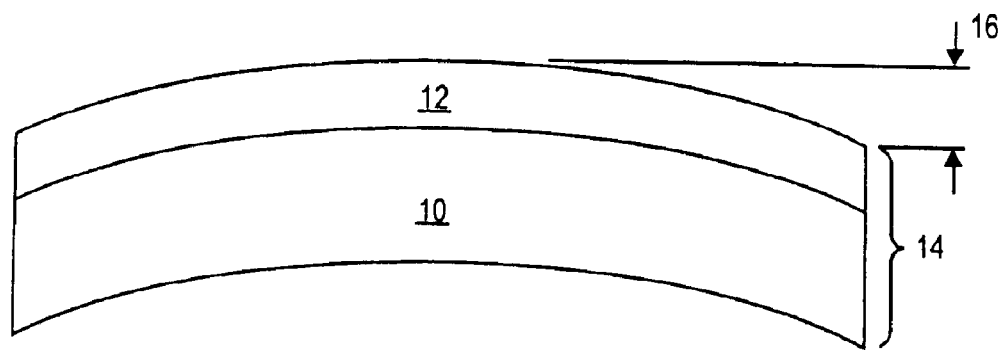
FIG. 2 is a view similar to FIG. 1 after the formation of a diamond intermediate substrate on the handle substrate, and subsequent cooling of the combination.

As illustrated in FIG. 2, a diamond intermediate substrate 12 is subsequently formed on the handle substrate 10. The combination of the handle substrate 10 and the intermediate substrate 12 forms a first combination wafer 14. The intermediate substrate 12 is formed at an elevated temperature and has a lower CTE than the handle substrate 10, so that subsequently cooling of the combination wafer 14 results in more contraction of the handle substrate 10 than the intermediate substrate 12. The combination wafer 14 bows into a first shape due to the differential CTEs of the handle substrate 10 and the intermediate substrate 12. The combination wafer 14 may bow by a depth 16 of between 200 and 300 microns, if the combination wafer 14 has a diameter of about 200 mm.

Figure 3:
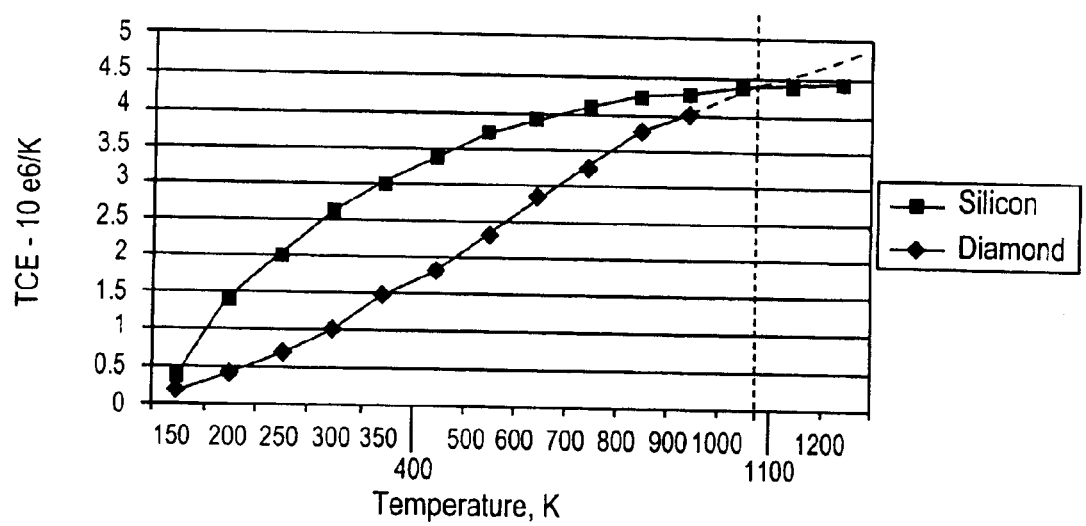
FIG. 3 is a graph of coefficients of thermal expansion (CTEs) of silicon and diamond at different temperatures.

As illustrated in FIG. 3, diamond has a CTE below that of silicon at all temperatures below approximately 1080 K. In the present example, therefore, the diamond is preferably formed at a temperature below 1000° C. The depth 16 can be controlled by adjusting the deposition temperature of the diamond.

Figure 4:
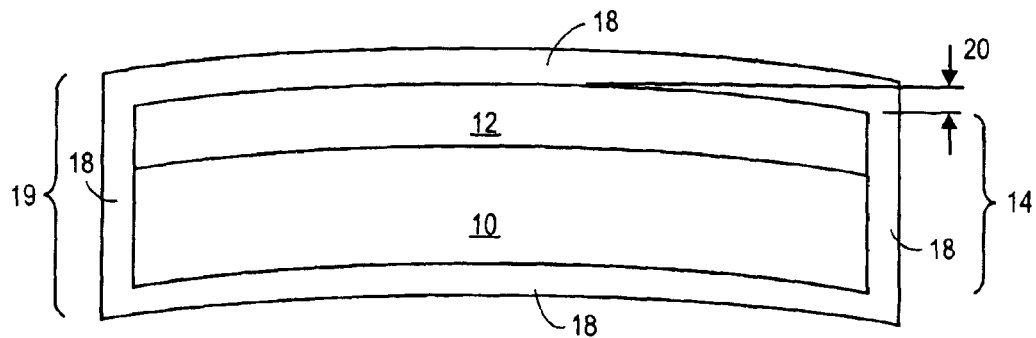
FIG. 4 is a view similar to FIG. 3 after a compensating polysilicon layer is formed to counteract bowing induced due to the process resulting in the structure of FIG. 2.

As illustrated in FIG. 4, a polysilicon compensating layer 18 is subsequently formed on all surfaces of the first combination wafer 14 to form a second combination wafer 19. The compensating layer 18 grows differently on the diamond of the intermediate substrate 12 and the silicon of the handle substrate 10, so that the compensating layer 18 has a higher CTE on the intermediate substrate 12 on the handle substrate 10. The compensating layer 18 is formed at an elevated temperature. Subsequent cooling of the compensating layer 18, together with the combination wafer 14, causes faster contraction of the compensating layer 18 on the intermediate substrate 12 and on the handle substrate 10, so that the combination wafer 14 is bent in an opposite direction that tends to return the handle substrate 10 to its shape in FIG. 1. The second combination wafer 19 then has a second shape with a bow having a depth 20 of approximately 5 microns, but the depth 20 could be as low as zero microns.

Figure 5:
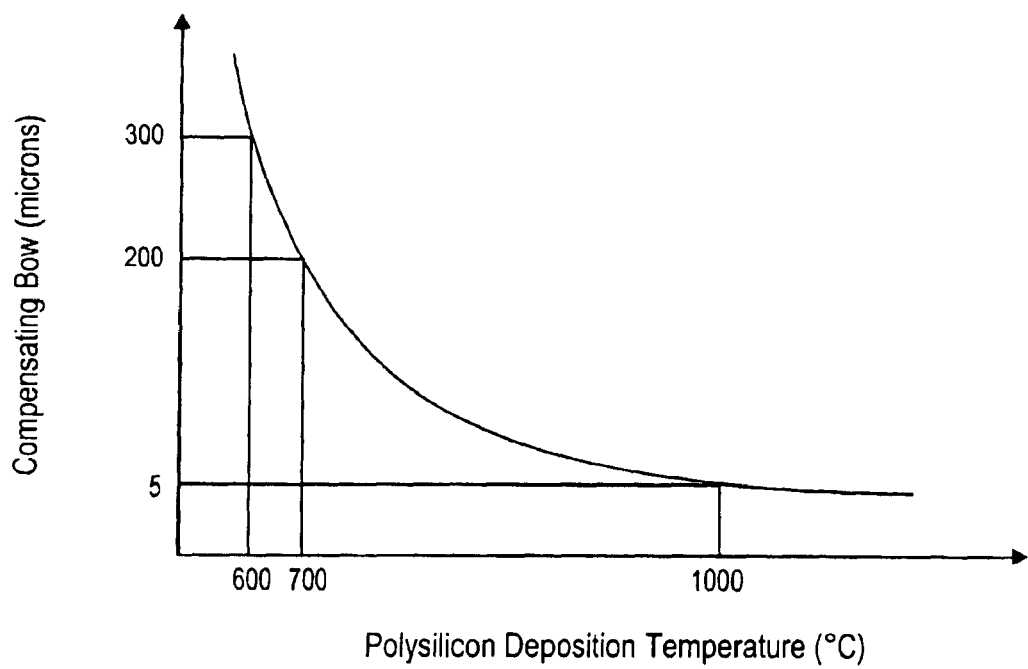
FIG. 5 is a graph representing a compensating bow as a function of deposition temperatures of the compensating polysilicon layer.

As illustrated in FIG. 5, the degree to which the polysilicon compensating layer 18 returns the combination wafer 14 to its original shape (i.e., the difference between the depth 16 in FIG. 2 and the depth 20 in FIG. 4) depends on the deposition temperature of the polysilicon compensating layer 18. Lower deposition temperatures return the combination wafer 14 to its original shape more than higher deposition temperatures. A deposition temperature of 600° C. may create a compensating bow of 300 microns, whereas a deposition temperature of 1000° C. will only create a compensating bow of 5 microns. In the case where the original bow has a depth 16 of 200 microns, a polysilicon deposition temperature of 700° will create a compensating bow of 200 microns, so that the depth 20 is zero.

Figure 6:
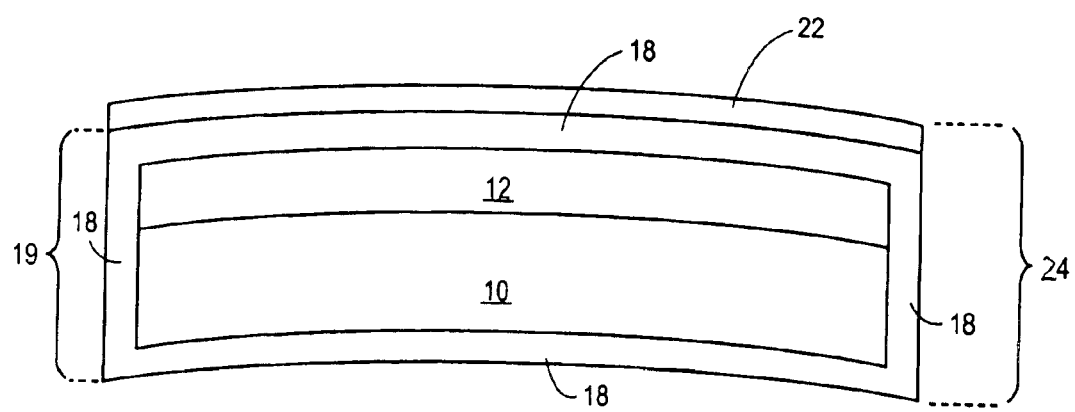
FIG. 6 is a view similar to FIG. 4 after a monocrystalline silicon layer is formed on the structure of FIG. 4.

Referring now to FIG. 6, a monocrystalline silicon (semiconductor) layer 22 is subsequently formed on an upper surface of the compensating layer 18, and is thereby connected through the compensating layer 18 to the intermediate layer 12. The monocrystalline silicon layer 22, for example, may be formed by attaching a wafer substrate to the compensating layer 18, and then grinding the wafer substrate back to a desired thickness to form a final combination wafer 24. The final combination wafer 24 typically has a monocrystalline silicon handle substrate 10 having a thickness of 500 to 650 microns, a diamond intermediate substrate 12 having a thickness of between 50 and 200 microns, and a monocrystalline silicon layer 22 having a thickness of approximately 2 microns with a tolerance of approximately 0.5 microns.

Figure 7:
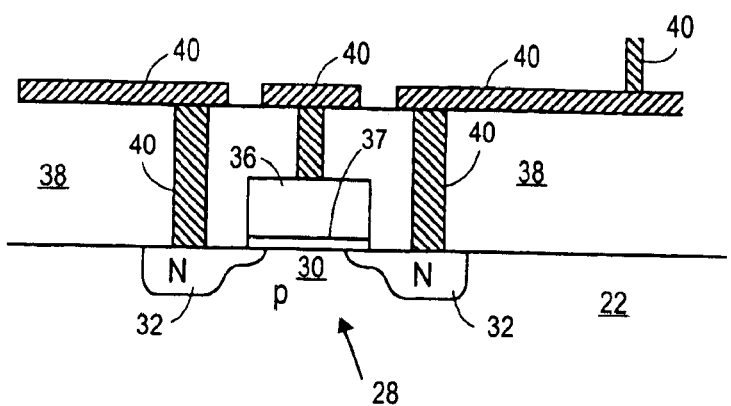
FIG. 7 is a side view illustrating a transistor and other portions of an integrated circuit that are formed in and on the monocrystalline silicon layer.

As illustrated in FIG. 7, a plurality of transistors 28, one of which is shown, are subsequently formed in and on the monocrystalline silicon layer 22. The monocrystalline silicon layer 22 is P-doped, so that each transistor 28 has a channel 30 which is P-doped. N-doped source and drain regions 32 are formed by implanting impurities on opposing sides of the channel 30. Each transistor 28 further has a gate dielectric layer 34 formed on the channel 30, and a conductive gate electrode 36 on the gate dielectric layer 34. Further aspects of the manufacture of transistors are known in the art, and are not discussed in detail herein. As will also be understood in the art, non-conductive dielectric layers are subsequently formed over the monocrystalline silicon substrate layer 22 and the transistors 28 with conductive vias and metal lines 40 that interconnect the transistors 28 and other components to create an integrated circuit. What should be noted is that the channels 30 of the transistors 28 are at this stage not stressed.

Figure 8:
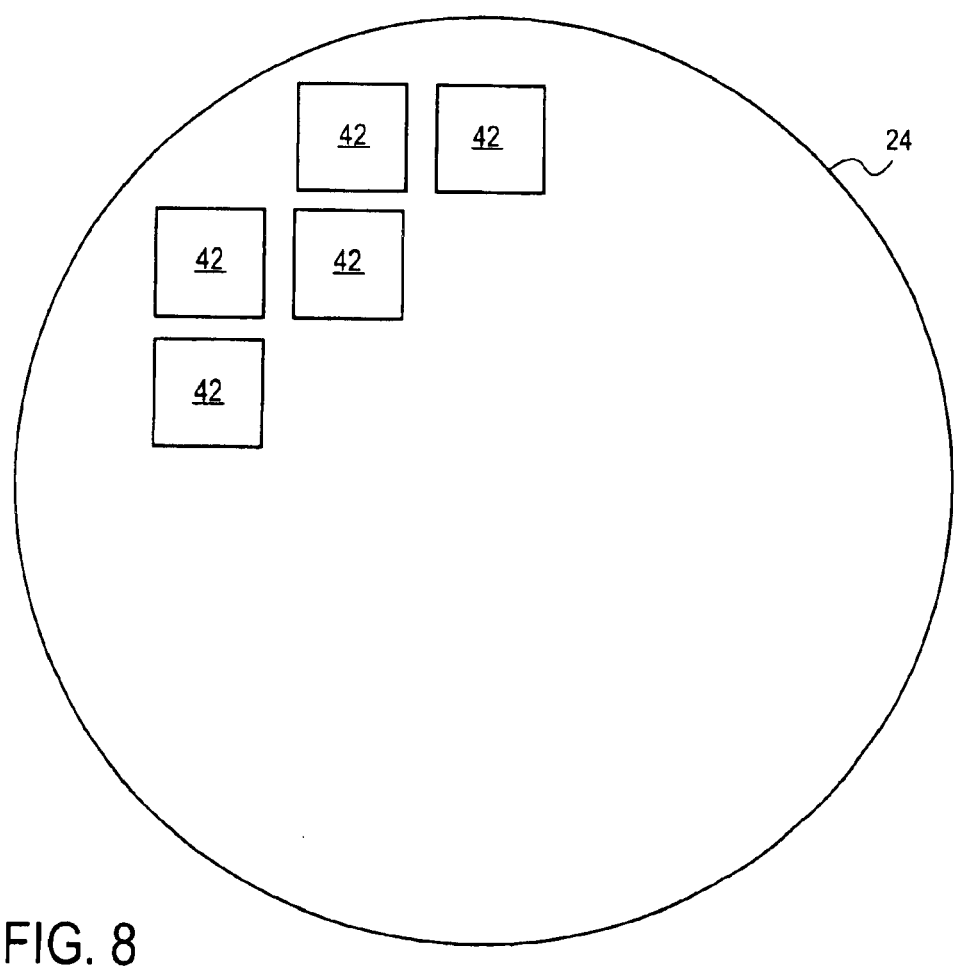
FIG. 8 is a plan view illustrating a combination wafer of FIG. 6 with a plurality of integrated circuits formed in rows and columns thereon.

As illustrated in FIG. 8, the combination wafer 24 has a plurality of such integrated circuits 42. The integrated circuits 42 are identical to one another, and are replicated in rows and columns over the combination wafer 24.

Figure 9:
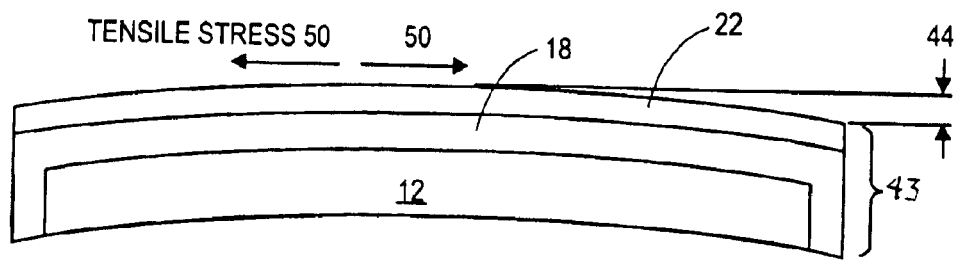
FIG. 9 is a view similar to FIG. 6 after the handle substrate is removed to increase bowing of the resulting combination wafer and induce a stress in the monocrystalline silicon film.

Reference is now made to FIG. 9. As illustrated, the handle substrate 10 of FIG. 6 is removed, together with the portions of the compensating layer 18 formed thereon. The handle substrate 10 may, for example, be removed in a grinding operation. Removal of the handle substrate 10 causes bowing of the remaining combination wafer 43 to a depth 44 of between 10 and 20 microns. Referring again to FIG. 2, the bowing of the combination wafer 14 is a balance struck between the tendency for the intermediate substrate 12 to create bowing of the combination wafer 14 and the tendency of the handle substrate 10 to resist any such bowing. Removal of the handle substrate 10, as illustrated in FIG. 9, thus removes the tendency for the handle substrate to resist bowing, and the tendency for the intermediate substrate 12 to bow then dominates. The tendency for the intermediate substrate 12 to bow is still counteracted, to an extent, by the compensating layer 18, so that the depth 44 of FIG. 9 is less than the depth 16 of FIG. 2. The effect of the bowing of the combination wafer 43 is that a tensile stress 50 is created in the monocrystalline silicon layer 22.

Figure 10:
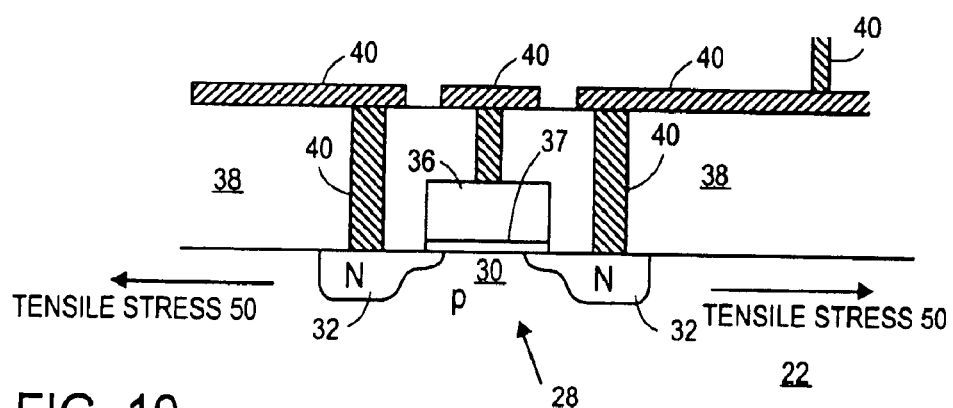
FIG. 10 is a view similar to FIG. 7, illustrating the stress in a channel of one of the transistors.

As illustrated in FIG. 10, the tensile stress 50 is in the channel 30 of each transistor 28. The stress in the channel 30 induces a strain in the channel 30. The strain-induced band structure modification and the mobility enhancement of silicon increases drive currents. The strain removes electron band degeneracy and produces energy shifts in the conduction and valence bands. It has been found that higher carrier mobility can be achieved by inducing biaxial tensile strain in thin (100) silicon films. In the present example, it has been shown that electron mobility values are increased from 1600 $cm^2/Vs$ to about 2300 $cm^2/Vs$ for about a 1% biaxial tensile strain in silicon (M. V. Fischetti and S. E. Laux, Band Structure, deformation potentials, and carrier mobility in strained Si, Ge, and SiGe alloys, *J. Appl. Phys.* 80, 2234, 1996). A rough order of magnitude calculation of strain that can be introduced in the silicon as a result of differences in the CTE between diamond and silicon indicates that strain levels from about 0.8% to greater than 10% can be achieved over a diamond deposition temperature in the range of 600 to 1000° C.

An advantage of the process as described is that strained silicon on diamond wafers would be stable at elevated temperatures, as compared with SiGe-based materials. No diffusion or stress relaxation are expected at elevated temperatures (e.g., above 1000° C.). A further advantage is that the thickness of the monocrystalline silicon layer 22 can be varied over a broad range, increasing design options compared with SiGe-based materials. A further advantage is that there will be no misfit dislocations in the structures as described, since diamond deposition does not involve epitaxy required in SiGe-based processes. The silicon layer quality will thus be high. Furthermore, conduction band energy band-splitting occurs due to biaxial tensile strain, leading to enhanced electron mobility. It has been found that compared to the conduction band, larger strain is required to induce a given splitting in the balance band. Larger strain in the silicon can be introduced with a silicon-on-diamond structure as described than with strained silicon on relaxed SiGe, thus opening up the possibility for both electron and whole mobility enhancement with large biaxial tensile strain in the silicon. The presence of the diamond film beneath the silicon, due to the exceptional thermal conductivity of diamond, has the additional important advantage of spreading heat from hot spots in the circuit during device operation.

The combination wafer 43 is subsequently singulated into individual dies, wherein the transistors in each die are stressed. Referring to FIG. 8, each die includes a respective one of the circuits 42. The dies may then be packaged according to known methods.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of fabricating a microelectronic die, comprising:

manufacturing transistors in and on a semiconductor substrate;

forming an intermediate substrate on a handle substrate;

allowing the intermediate substrate and handle substrate to cool, the intermediate substrate having a different CTE than the handle substrate;

connecting the semiconductor substrate to the intermediate substrate; and at least partially removing the handle substrate to stress a channel of each transistor after the transistors are manufactured.

2. The method of claim 1, wherein a tensile stress is applied to each channel.

3. The method of claim 1, wherein the intermediate substrate is made of diamond.

4. The method of claim 1, wherein the intermediate substrate and the handle substrate bow into a first shape when allowed to cool, and the semiconductor substrate and the intermediate substrate bow into a final shape when the handle substrate is removed.

5. The method of claim 4, further comprising:

changing the first shape into a second shape with less bow than the first shape before the semiconductor substrate is connected to the intermediate substrate.

6. The method of claim 5, wherein the first shape is changed into the second shape by applying a compensating layer.

7. The method of claim 6, wherein the compensating layer is made of silicon.

8. The method of claim 6, wherein the compensating layer is formed on major surfaces of both the intermediate substrate and the handle substrate but has a different CTE on the intermediate substrate than on the handle substrate.

9. The method of claim 1, further comprising:

singulating the semiconductor substrate after the channels are stressed.

10. A method of fabricating a microelectronic die, comprising:

forming a first combination wafer, including a handle substrate and an intermediate substrate on the handle substrate;

allowing the first combination wafer to cool, the intermediate substrate having a lower CTE than the handle substrate so that the combination wafer bows into a first shape;

forming a compensating layer on the combination wafer to form a second combination wafer;

allowing the second combination wafer to cool, the compensating layer having a CTE which, compared to the CTEs of the handle substrate and the intermediate substrate, changes the first shape into a second shape with less bow;

connecting a semiconductor substrate to the second combination wafer; and at least partially removing the handle substrate to change the second shape into a third shape and create a stress in the semiconductor substrate.

11. The method of claim 10, further comprising:

forming a plurality of transistors in and on the semiconductor substrate before removing the handle substrate.

12. The method of claim 10, wherein the intermediate substrate is made of diamond.

13. The method of claim 10, wherein the compensating layer is made of silicon.

14. The method of claim 10, wherein the compensating layer is formed on major surfaces of both the intermediate substrate and the handle substrate but has a different CTE on the intermediate substrate than on the handle substrate.

* * * * *